United States Patent

Loughran et al.

[11] Patent Number: 4,764,485
[45] Date of Patent: Aug. 16, 1988

[54] METHOD FOR PRODUCING VIA HOLES IN POLYMER DIELECTRICS

[75] Inventors: James A. Loughran, Scotia; James G. McMullen, Pattersonville; Alexander J. Yerman, Scotia, all of N.Y.

[73] Assignee: General Electric Company, Schenectady, N.Y.

[21] Appl. No.: 617

[22] Filed: Jan. 5, 1987

[51] Int. Cl.⁴ .............................. C23F 1/02; B44C 1/22
[52] U.S. Cl. ..................................... 437/225; 156/643; 156/655; 156/656; 156/659.1; 148/DIG. 106; 148/DIG. 91; 148/DIG. 92; 148/DIG. 93; 148/DIG. 74; 219/121.65; 219/121.68; 219/121.67; 430/317; 437/173; 437/928; 437/935; 437/203
[58] Field of Search ............ 156/643, 655, 656, 659.1; 148/DIG. 106, DIG. 91, DIG. 92, DIG. 93, DIG. 94; 219/121 LE, 121 LH, 121 LG; 29/578, 590, 591; 430/317

[56] References Cited

U.S. PATENT DOCUMENTS

| | | | |
|---|---|---|---|
| 3,193,418 | 7/1965 | Cooper et al. | 29/578 |
| 3,920,951 | 11/1975 | Chovan et al. | 219/121 LH |
| 4,347,306 | 8/1982 | Takeda et al. | 29/577 R |
| 4,490,210 | 12/1984 | Chen et al. | 156/643 |
| 4,503,315 | 3/1985 | Kamioka et al. | 219/121 E |
| 4,542,037 | 9/1985 | Delfino | 219/121 LE |
| 4,665,295 | 5/1987 | McDavid | 219/121 LH |

OTHER PUBLICATIONS

Hodgsom, "Ohmic Contacts Made by Lasers", IBM TD13, vol. 12, No. 10, Mar. 1979, p. 4286.

Primary Examiner—Brian E. Hearn
Assistant Examiner—Beverly A. Powlikowski
Attorney, Agent, or Firm—Marvin Snyder; James C. Davis, Jr.

[57] ABSTRACT

A method for producing a hole in a polymer film includes the steps of depositing a conductive layer onto the polymer film and irradiating a spot on the layer with a burst of focused laser energy at a level sufficient to form an opening in the film and, subsequently, plasma etching the film so as to form a hole of desired depth in the polymer film underlying the opening in the conductive layer. This method is particularly applicable to the formation of multichip intergrated circuit packages in which a plurality of chips formed in a semiconductor wafer are coated with a polymer film covering the chips and the substrates. The holes are provided for the purpose of interconnecting selected chip contact pads via a deposited conductive layer which overlies the film and fills the holes.

11 Claims, 2 Drawing Sheets

METHOD FOR PRODUCING VIA HOLES IN POLYMER DIELECTRICS

BACKGROUND OF THE INVENTION

The present invention is generally directed to a method and apparatus for producing via holes in polymer dielectrics without the use of a mask. More particularly the present invention is directed to producing via holes in a dielectric film which is deposited over integrated circuit chips, the film operating as an insulative support medium for conductive material which interconnects the contact pads on the same and/or different chips where the chips may exist within a wafer or be separate and supported on a substrate. The conductive material takes the form of a patterned metal layer which overlaps and fills the holes in the film. The method and apparatus of the present invention produces via holes in a polymer film overlay and thereby provides a means for electrically interconnecting parts of one or a plurality of circuit chips disposed on a substrate through the vias thus formed as specifically provided in copending and commonly assigned patent application Ser. No. 947,151, (RD-17193), filed in the name of Alexander J. Yerman and Constantine A. Neugebauer, entitled "Fabrication of Large Power Semiconductor Composite By Wafer Interconnection of Individual Devices". It is also noted that the present invention provides significant advantages in a system of microchip packaging.

Polymer dielectrics are finding increased use in multichip packaging approaches because such dielectrics are easily applied at low tempertures and result in relatively thick coatings having a low dielectric constant. More particularly, the problem addressed by the present invention is the production of holes in such polymer layers for the purpose of connecting metallization on the top of the polymer to metallization under the polymer dielectric.

One prior art method for providing such via holes in a polymer is to apply a metal mask to the top surface of the polymer by metal deposition. For example, a 1,000 Angstrom thick layer of titanium can be applied. The titanium is then processed by photolithographic methods and holes are etched in the titanium where via holes are desired. The polymer is then etched in an oxygen plasma. The oxygen plasma does not attack the titanium, but does attack the exposed polymer. One main disadvantage of this technique is that it involves a substantial number of steps which add greatly to the complexity and expense of process: depositing the metal mask which involves first cleaning the polymer for good adhesion then depositing a photoresist, drying the resist, exposing the resist, developing the resist, hardbaking the resist, then etching holes in the metal mask. Secondly, these patterning steps involve the use of masks which are not easily changed if such changes are necessary due to changes in the circuits being fabricated. This is followed by a carefully controlled plasma etch step which is highly dependent on the temperature of the etchant and gas pressures. Additionally, the metal mask layer must be removed in order to assure good adhesion between the conductor metallization which is to be applied next and the polymer.

An alternative approach to forming via openings is to spin or spray polyimide on a substrate and only partially cure the polyimide. Subsequently, the polyimide is coated with a photoresist and the resist is developed. In the partially cured state, the polyimide is also attacked by the developer and via holes can be etched in thin films of polyimide. This process is not satisfactory for thick films of polyimide since entrapped water vapor in the polymer cannot escape. The limit on this process is a thickness of 5 microns. In addition, this process could not be used to produce an overlay layer across the space between two chips since there is no supportive film involved in spraying or spin methods. Photosensitive polyimides are becoming available, but they suffer the same problems of thickness and inability to provide a continuous film across two chips.

A method which can be used to provide via openings through relatively thick layers of polymer involves patterning the lower layer of metallization and building up by electroplating the areas where vias are desired. This essentially leaves pillars of conductor material where the via is desired. Polymer material is then sprayed or spun on the substrate in multiple coats with sufficient curing between coats to allow solvent and byproducts of the curing process to escape. Enough coats are built up to completely cover the conductors, but to barely cover the via pillars. Short etch or even mechanical lapping is sufficient to uncover the top surface of the via pillars. While this method results in a planar surface, it involves a large number of steps and, again, cannot be used where an overlay layer must bridge a gap between two chips.

In addition to the problems associated with the approaches described above for providing via holes, it is noted that these processes cannot be achieved without the use of wet processing; that is, wet chemistry must be employed for developing a photoresist for etching of the mask or for the plating of the via areas. A distinguishing characteristic of the disclosed invention is that it is achieved using a plasma etch, which is a dry process.

The use of lasers for drilling holes is another method employed in the prior art to provide vias, Typically, a laser is used in a pulsed mode to evaporate polymer material wherever the laser energy is concentrated. Very short pulses heat the material to the point that it vaporizes. This approach, however, is not satisfactory for providing via holes in the circumstances contemplated herein. First, in such methods, the underlying pads may be damaged by energy which is sufficient to vaporize the polymer. It is unacceptable to damage the underlying pads. Second, the process is relatively slow in that several pulses are required. In an interconnect system, a large number of holes is required so that slow processes are again unacceptable.

The polymer film may also be provided with holes by the process described in copending and commonly assigned patent application Ser. No. 912,455 (RD-17428) in which a laser is focussed on a polymer to sensitize it to the extent that it can be selectively removed in a plasma etching process. In such a process, however, the sensitization of the polymer requires that radiation within a given exposure window be applied and this may be difficult to control because of variations in laser inter-pulse intensity, polymer absorption, etc.

SUMMARY OF THE INVENTION

In accordance with a preferred embodiment of the present invention, a method for producing via holes in the polymer film comprises the following steps. A layer of a suitable conductor such as chromium or chromium-copper is deposited on the polymer film. Then a spot on the conductive layer is irradiated above where the hole in the polymer is desired by means of short focused bursts of electromagnetic energy in the visible region at an intensity level sufficient to evaporate a portion of the metal layer and thereby create an opening therein. This is preferably accomplished by means of a laser operated in a repetitive capacitive discharge mode. Subsequent to the irradiation, the dielectric film is plasma etched so as to make a hole in the film directly underlying the previously made opening in the conductive layer. The plasma etching also serves a second purpose, namely that of preparing the surface of the conductive layer for subsequent application of a second augmenting metallization layer to initiate the interconnection of the semiconductor contact pads underlying the polymer film. This method is particularly useful for films between about 5 and about 50 microns in thickness. The conductive layer is then patterned by etching to complete the electrical interconnection system.

Accordingly, it is an object of the present invention to provide a method for directly forming via holes which method requires a minimum number of processing steps.

It is yet another object of the present invention to provide a method for directly forming via holes which does not require an etch mask.

It is a still further object of the present invention to provide a method of directly forming via holes which can be achieved completely with dry processing methods.

A still further object of the present invention is to provide a method for directly forming via holes which is compatible with polymer overlay interconnect methods; that is a method which is compatible with the use of polymer films.

It is another object to provide a process for forming holes in a polymer film by use of a laser in which the damage caused by the laser is confined to non-sensitive materials.

Yet another object is to provide a system for forming holes in a dielectric film which may be easily programmed to change the resultant pattern of electrical interconnections of chips which are located under the film.

Lastly, but not limited hereto, it is an object of the present invention to facilitate the interconnection of multiple electronic circuit chip packages affixed to a substrate and covered by a polymer film bridging the chips.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION OF THE INVENTION

Figure 1:
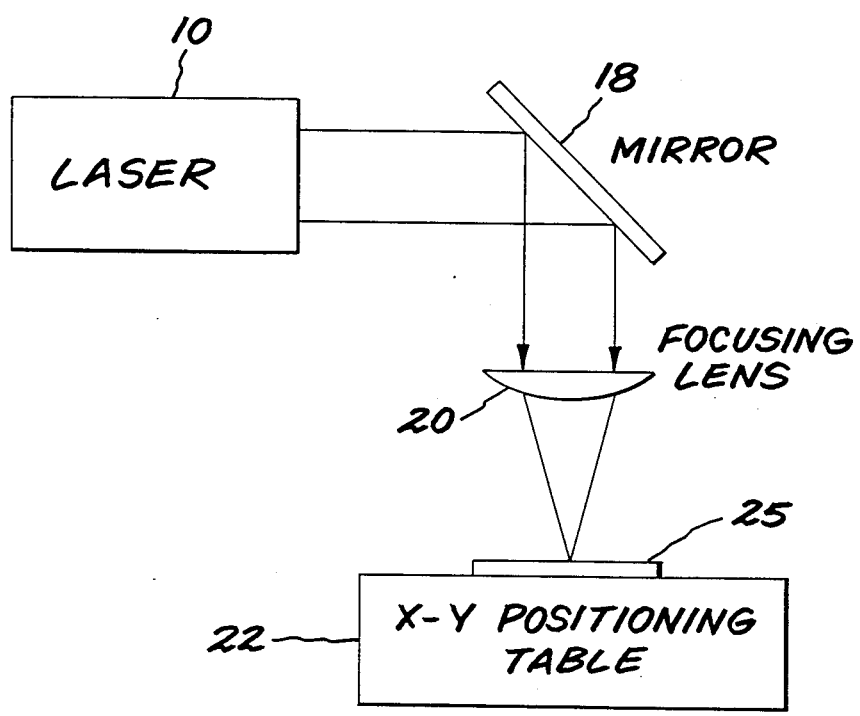
FIG. 1 is a schematic side elevation view of an apparatus for carrying out the method of the present invention.

FIG. 1 illustrates the essential parts of a laser system for directly forming via holes in accordance with a preferred embodiment of the present invention. In FIG. 1 there is shown laser 10 which preferably comprises an xenon laser operated in the optical range from approximately 0.48 to 1.54 microns. This wavelength of radiation has been focused to be adequately absorbed by conductive layers most commonly used in semiconductor processing and, in particular, those most appropriate for use in the process of this invention. The light output of laser 10 is reflected 90° by a corner reflector 18 and focused onto a small spot on the workpiece 25 by means of a focusing lens 20. While not shown in FIG. 1, intermediate to the laser 10 and the mirror 18 is located a variable aperture apparatus for defining the spot size in a conventional manner. In a capacitive discharge mode, the beam energy is controlled by the voltage or charge on the capacitor. Depending on the characteristics of the circuit being fabricated, a spot size in the range of from 50–500 microns in diameter may be used. The substrate which carries the polymer film in which the via holes are to be fabricated is placed on x-y table 22 so that the substrate can be moved. In this manner, the focused laser spot may be made to fall at a point on the workpiece 25 where the via hole is desired.

Figure 2A:
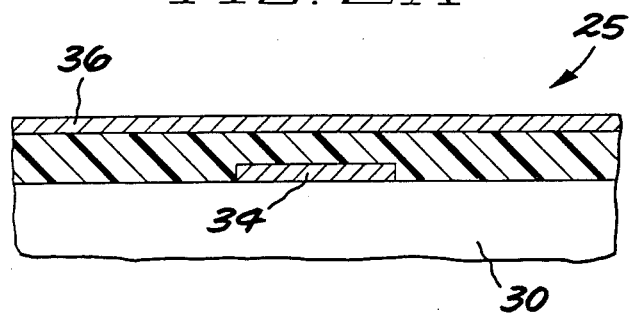
FIG. 2A is a cross-sectional side elevation view illustrating the results of an initial step of coating a polymer with a conductive layer carried out in accordance with the present invention.
Figure 2B:
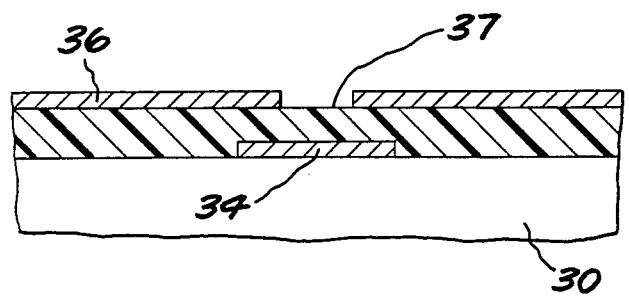
FIG. 2B is a view illustrating an opening created in the conductive layer of FIG. 2A by means of focused laser light in accordance with the present invention.
Figure 2C:
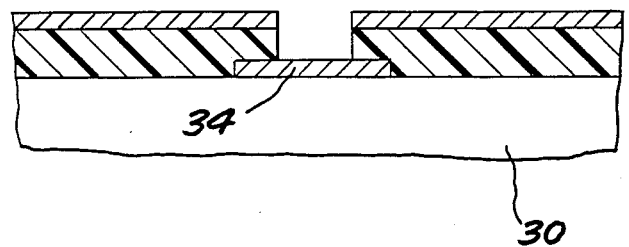
FIG. 2C is a view showing a hole provided in a polymer film immediately beneath the opening in the conductive layer as a result of a plasma etching step.

FIGS. 2A, 2B and 2C illustrate the results of the process steps in accordance with the present invention. In particular, FIG. 2A shows dielectric film 32 deposited over conductive pad 34 on substrate 30. It should be borne in mind that while FIG. 2 illustrates only one conductive micropad 34 as part of the underlying structure of substrate 30, in reality, in the situations contemplated by the present inventors, substrate 30 and micropad 34 actually are generally a part of a much more complicated microchip structure. In particular the substrate 30 may be a fabricated semiconductor wafer containing a plurality of individual chips, each of which includes several micropads 34, as is discussed in the aforementioned copending application Ser. No. 947,151 (RD-17193).

FIG. 2A also shows a thin conductive layer 36 deposited on the dielectric film 32 and overlying contact pad 34. It should be pointed out that the step of plasma etching of a polymer is really performing two actions at the same time: that of cleaning the damaged area to produce via opening 38 (FIG. 2C) and that of cleaning the surface of layer 36 to prepare it for accepting a subsequent metallization layer. As was indicated above, one object of the present invention is to reduce the total number of processing steps. It is seen that the only processing steps involved to form the via openings are the original coating of the dielectric film 32 with a conductive layer 36 followed by laser exposure which, inturn, is followed by a cleaning step in a plasma etcher.

The specific details for carrying out the method of the invention on a fabricated semiconductor wafer of the type disclosed in the above noted copending application Ser. No. 947,151 (RD-17193) are as follows, with reference to the drawings. The wafer 30 is first probed and mapped to define the locations of all acceptable chips on the wafer 25, as outlined in the aforementioned copending application. The wafer 30 is then coated with a suitable dielectric layer 32 which typically might be a polyimide-siloxane varnish such as GE type SPI-1000 applied by spin coating. The polyimide coating is subsequently cured at a temperature of approximately 350°–475° C. In order to insure that small pinhole discontinuities are not present in the dielectric coating 32, in the preferred method, a second coating of the same dielectric is made in a manner identical with the first. The desired thickness of the dielectric film 32 may range from 5 microns to 50 microns, with a 10 micron thickness being preferred.

Following the application of the dielectric coating, a layer 36 of chromium, chromium-copper or some other suitable metal is deposited on the surface of the dielectric film 32 under high vacuum conditions. An initial sputter cleaning operation may optionally be performed on the dielectric film 32 to prepare it to accept the metal layer. The thickness of the conductive layer is in the range between 500 Angstroms to 5000 Angstroms, with a 1000 Angstrom thickness being optimal.

The next step in forming openings in the dielectric film 32 so that contact can be made at selected locations with the underlying wafer metallization pads 34 is to selectively remove small portions of the metal layer 36 directly above the area it is desired to etch through the film 32. This is done by mounting the wafer 25, FIG. 2A, on a positionable X-Y table 22, FIG. 1, onto which the xenon laser 10 is positioned to focus its output. The X-Y table 22 is movable in accordance with a drive means (not shown) which has been programmed to move the table so that metal contact pads 34 of acceptable chips on the wafer 25 are successively brought under the focused light from laser 10. In this manner, after an initial alignment operation program has been run, the table and laser are used to evaporate openings 37 in the metal layer above the contacts of all good chips in the wafer 25. Using a laser system such as a Florod MEL-10 or MEL-20 in the single shot mode, with a chromium layer 1000 Å thick, power settings in the range of 500 to 999 result in adequate removal which can be confirmed visually.

Following this, the wafer 25 is placed in a plasma etching system to etch holes in the polyimide layer 32. While a number of different equipment designs are suitable, a Barrel type plasma reactor with a gas mixture of 20% $CF_4$ and 80% $O_2$ has been found to etch holes 38 in layer 32, FIG. 3C, down to the underlying aluminum metallization pads 34 in about 20 minutes using a power level setting of about 300 watts.

After the holes have been etched, a second layer metallization (not shown) is applied by evaporating an additional chromium layer over the first so that the exposed semiconductor contacts pads 34 are all interconnected, as desired. This is followed by an evaporated copper layer (not shown) for solderability. This upper layer metal (all metal coated onto the dielectric film 32) is then patterned by etching as disclosed in the aforementioned application Ser. No. 947,151 (RD-17193) to interconnect appropriate contact pads.

Some of the advantages of the use of chromium or chromium-copper for the mask is its strong adherence to other materials, and its relative chemical inertness during the etching procedure. Because of the former property, it is frequently used as an intermediate layer for other metals. For example, it is frequently used as the first layer with copper to make contacts to aluminum because of its affinity for oxygen, and its strong adhesion. Since the chromium is only slowly attacked by the reactive ions of the Freon/Oxygen plasma it serves as an excellent mask for the plasma etching process used in this invention. The copper overlayer further enhances this immunity from attack.

The polymer layer 32 may comprise, in addition to the polyimide described above, ULTEM ™ polymer resin (as sold by the General Electric Company) polysulfone, XYDAR ™ (as sold by Dart Company) polyimide, MYLAR ™ plastic (as sold by Dupont de Nemours Company, Inc.) epoxy or virtually any other polymer. An alternate configuration for the polymer coating would be to deposit a first layer of an adhesive material with subsequent lamination of a dielectric polymer thereon. In an exemplary embodiment, ULTEM ™ thermoplastic resin is sprayed from a solvent carrier onto integrated circuit chips mounted on a substrate. Solvent is driven off at a temperature of 300° C. for two minutes. KAPTON ™ polyimide (as sold by the Dupont de Nemours Company, Inc.) is etched in a plasma etcher and laminated to the top surface of the integrated circuit chip using a pressure of approximately 50 pounds per square inch and a temperature of 260° C.

From the above, it should be appreciated that all of the aforementioned objects are achieved by the process of the present invention. In particular, it is seen that a dry chemical process having few steps is described for accurately producing via holes in polymer films. In particular, it is seen that the method of the present invention is particularly usable with polymer materials which are capable of bridging multiple integrated circuit chips affixed to a common substrate.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method for producing via holes in a polymer film without employment of a mask, said method comprising the steps of:

coating said film with a thin conductive layer;

successively irradiating single spots at desired locations on said layer, directly above where said via holes are desired, with a burst of electromagnetic energy, each said burst of energy being focussed on a selected one of said spots at a time and being of a level sufficient to evaporate portions of said layer thereat and thereby create openings in said layer; and plasma etching said film so as to create said via holes therein directly below said openings.

2. The method of claim 1 wherein said electromagnetic energy is produced by a laser.

3. The method of claim 2 in which said laser is an xenon laser.

4. The method of claim 2 in which said laser operates at a wavelength in the range of approximately 0.48 to 0.54 microns.

5. The method of claim 1 in which said spots are each in the range of approximately 50–500 microns in diameter.

6. The method of claim 1 in which said film is from approximately 5 to approximately 50 microns in thickness.

7. The method of claim 2 in which said laser is operated in a pulsed mode.

8. The method of claim 1 in which said polymer film is selected from the group consisting of polysulfone, XYDAR ™, POLYIMIDE, Polyimide-Siloxane Copolymers, MYLAR ™ and epoxy.

9. The method of claim 1 in which said etching occurs in an oxygen atmosphere.

10. The method of claim 1 in which said etching occurs in an atmosphere comprising approximately 80% oxygen and 20% $CF_4$.

11. The method of claim 1 in which said etching occurs at a pressure of approximately 0.5 torr.

* * * * *